US012750970B2

(12) United States Patent
Ilic et al.

(10) Patent No.: US 12,750,970 B2
(45) Date of Patent: Sep. 29, 2026

(54) TEST SYSTEM RACK WITH RECONFIGURABLE POSITION FOR SYSTEM INTERFACE

(71) Applicant: NATIONAL INSTRUMENTS CORPORATION, Austin, TX (US)

(72) Inventors: Kosta Ilic, Austin, TX (US); Michael H. Singerman, Lincoln, TX (US); Kevin Krietz, Austin, TX (US)

(73) Assignee: National Instruments Corporation, Austin, TX (US)

( * ) Notice: Subject to any disclaimer, the term of this patent is extended or adjusted under 35 U.S.C. 154(b) by 505 days.

(21) Appl. No.: 18/491,891

(22) Filed: Oct. 23, 2023

(65) Prior Publication Data

US 2025/0133684 A1 Apr. 24, 2025

(51) Int. Cl.
*H05K 7/14* (2006.01)

(52) U.S. Cl.
CPC ......... *H05K 7/1492* (2013.01); *H05K 7/1489* (2013.01)

(58) Field of Classification Search
CPC ..... H05K 7/1492; H05K 7/1489; G01D 11/30
USPC ........................................... 73/431, 493, 756
See application file for complete search history.

(56) References Cited

U.S. PATENT DOCUMENTS

| | | | | |
|---|---|---|---|---|
| 6,459,571 B1 * | 10/2002 | Carteau | G06F 1/184 | 361/679.33 |
| 7,715,207 B2 * | 5/2010 | Behrens | G06F 1/18 | 361/803 |
| 8,854,822 B2 * | 10/2014 | Hazzard | H05K 7/1498 | 361/725 |
| 10,251,480 B2 | 4/2019 | Chen | | |
| 2020/0186457 A1 * | 6/2020 | Zhao | H04L 43/50 | |
| 2023/0129374 A1 * | 4/2023 | Albright | H05K 7/20172 | 439/527 |

* cited by examiner

*Primary Examiner* — James Wu
*Assistant Examiner* — Dakota M Talbert
(74) *Attorney, Agent, or Firm* — Kowert, Hood, Munyon, Rankin & Goetzel, P.C.; Jeffrey C. Hood; Luke Langsjeon

(57) ABSTRACT

A test system rack or cabinet includes a housing containing instruments or equipment and a mass interconnect (MIC) mounted within the housing. The MIC has inputs to couple to the instruments or equipment and outputs to couple to a second MIC separate from the rack. The test system rack has legs positioned underneath the housing to support the housing and the first MIC. The test system rack has actuators configured to adjust a position of the first MIC without adjusting a position of the one or more legs.

20 Claims, 8 Drawing Sheets

TEST SYSTEM RACK WITH RECONFIGURABLE POSITION FOR SYSTEM INTERFACE

BACKGROUND

Technical Field

The present invention relates generally to racks and cabinets for housing test systems, instruments, and equipment.

Description of the Related Art

Various types of electronic devices may be mounted in a test system rack or cabinet in order to facilitate interfacing with the devices, containing the devices, managing the devices, or other reasons. A test system rack may be configured with a mass interconnect (MIC) configured to receive input from multiple devices and provide output to a second MIC installed on a separate rack. The lack of adjustability of traditional static test system MICs makes it burdensome for operators to interact with the system. Additionally, a static MIC makes the test system inflexible to use in multiple instances where the test system has to interface with other equipment. As such, improvements in the field of MIC repositioning in a test system rack or cabinet are desirable.

SUMMARY

Embodiments herein describe test system racks and cabinets configured to house test instruments and/or equipment, and methods for operating said racks and cabinets.

In some embodiments, the rack has installed thereon a mass interconnect (MIC) with inputs to couple to the test instruments and/or equipment and outputs to couple to other MICs on other racks.

In some embodiments, the rack includes one or more legs positioned underneath the housing and configured to support the housing and the MIC.

In some embodiments, the rack includes one or more actuators configured to adjust the position of the MIC without adjusting the position of the one or more legs.

In some embodiments, the rack includes a sensor configured to automatically detect a position of a second MIC on a separate rack, and the rack is configured to automatically adjust the position of the MIC to facilitate connection with the second MIC.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

Figure 1A:
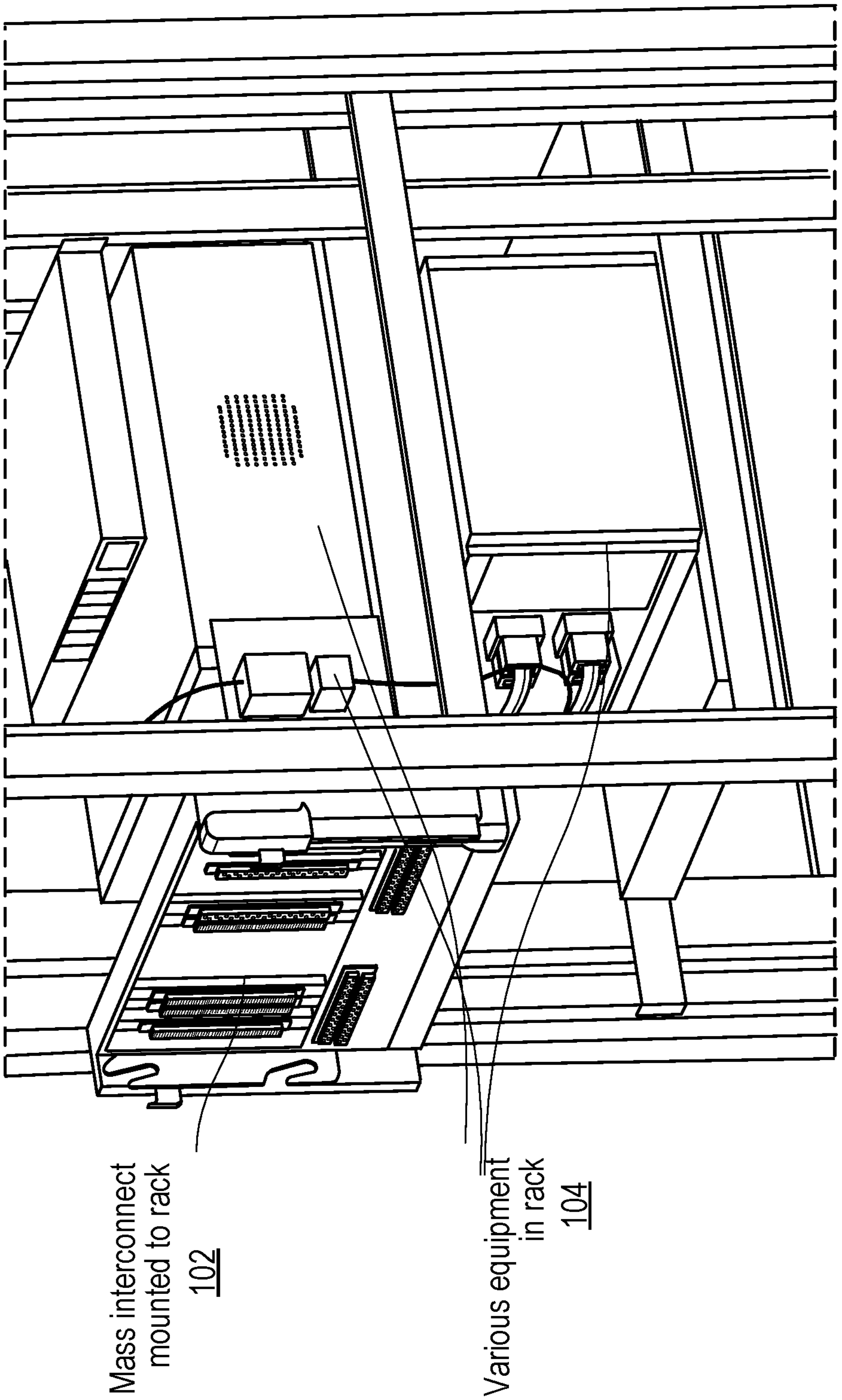
FIG. 1A is a schematic diagram of a mass interconnect (MIC) mounted on a rack and connected to test equipment, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure, including the appended claims. Particular features, structures, or characteristics may be combined in any suitable manner consistent with this disclosure.

It is to be understood that the terminology used herein is for the purpose of describing particular embodiments only, and is not intended to be limiting. As used herein, the singular forms “a”, “an”, and “the” include singular and plural referents unless the content clearly dictates otherwise. Furthermore, the words “can” and “may” are used throughout this application in a permissive sense (i.e., having the potential to, being able to), not in a mandatory sense (i.e., must). The term “include,” and derivations thereof, mean “including, but not limited to.” The term “coupled” means directly or indirectly connected.

Within this disclosure, different entities (which may variously be referred to as “units,” “circuits,” other components, etc.) may be described or claimed as “configured” to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be “configured to” perform some task even if the structure is not currently being operated. A “mobile device configured to generate a hash value” is intended to cover, for example, a mobile device that performs this function during operation, even if the device in question is not currently being used (e.g., when its battery is not connected to it). Thus, an entity described or recited as “configured to” perform some task refers to something physical, such as a device, circuit, memory storing program instructions executable to implement the task, etc. This phrase is not used herein to refer to something intangible.

The term "configured to" is not intended to mean "configurable to." An unprogrammed mobile computing device, for example, would not be considered to be "configured to" perform some specific function, although it may be "configurable to" perform that function. After appropriate programming, the mobile computing device may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Instruments for collecting data or information from an environment or unit under test may be coupled to and controlled by computer systems. Data collected by these instruments may be used to control units being tested (e.g., an overheated unit may be shutdown) or an environment (e.g., ventilation systems may be activated if a certain chemical is detected in the air). Data may also be displayed to a user for control and/or experimental purposes (e.g., to improve the design of the unit being tested). Instruments and/or computer systems may also perform various data analysis and data processing on acquired data prior to control of the unit and/or display of the data to the user. Examples of various types of instruments include oscilloscopes, digital multimeters, pressure sensors, etc., and the types of information that might be collected by respective instruments include voltage, resistance, distance, velocity, pressure, oscillation frequency, humidity or temperature, among others.

Instrumentation systems such as those described above may run on a platform such as Peripheral Component Interconnect (PCI) eXtensions for Instrumentation (PXI). PXI may combine a high-speed PCI bus with integrated timing and triggering features designed for measurement and automation applications to deliver performance improvements over other architectures. PXI may be built on a modular and scalable CompactPCI specification and the high-speed PCI bus architecture. As a result, PXI products may maintain interoperability with CompactPCI, offering increased mechanical integrity, easier systems integration, and more expansion slots than desktop computers. However, due to the compact design of these modules, the instrumentation may be concentrated in a small region of the test system. Accordingly, a large number of connections to the input of the mass interconnect (MIC) may originate from a relatively small volume within the rack (e.g., rather than from originating from a dispersed set of positions if the instruments were placed further apart. Embodiments herein may operate effectively with this design, by moving the group of instruments together with the MIC, as described herein.

Figure 1B:
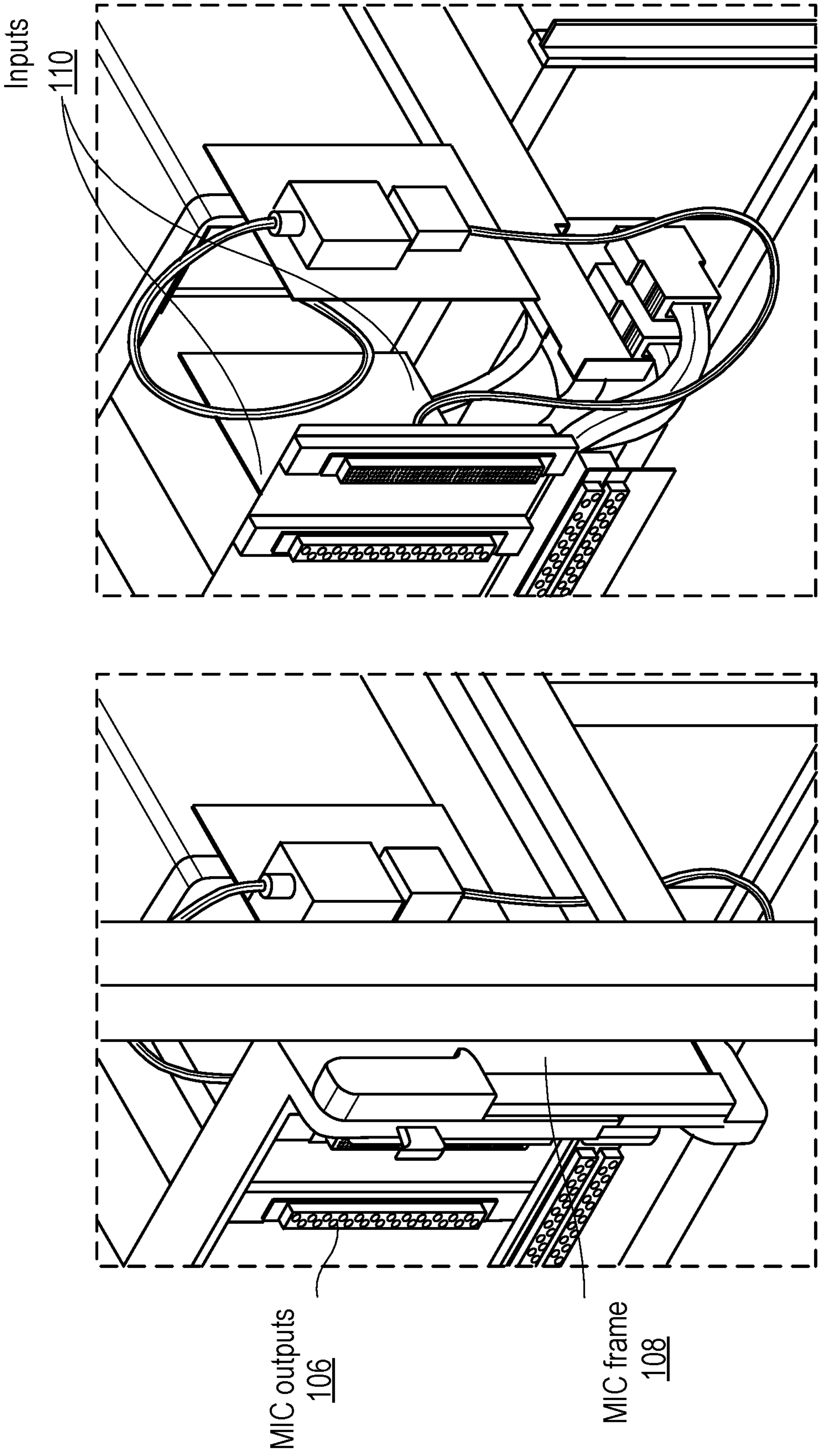
FIG. 1B is a schematic diagram illustrating inputs and outputs on a MIC mounted in a rack, according to some embodiments.

FIG. 1A is a schematic diagram of a mass interconnect (MIC) 102 mounted on a rack and connected to test equipment 104, according to some embodiments. As illustrated, the MIC is installed on an exterior wall of the rack, and is connected to different types of equipment that are installed within the rack. FIG. 1B is a schematic diagram illustrating inputs and outputs on a MIC mounted in MIC frame 108 within a rack, according to some embodiments. The MIC is installed on a MIC frame and the outputs 106 of the MIC are exterior-facing, so that they may interface with other MICs (e.g., installed on separate racks). The inputs 110 are connections of various types on the interior side of the rack frame, which are configured to connect to equipment installed on the rack.

Test System Racks

Traditional test systems (e.g., racks or cabinets) typically have critical interfaces (e.g., mass interconnects) at fixed, unmovable positions at the time of assembly. When a test system is operated by multiple different operators, this single height may not be appropriate for all of them, leaving some users susceptible to repetitive strain injury or limiting the number (and physical shape) of users who may be able to operate the device effectively or even at all. For example, if the target operators cover men and women between 5% and 95% respective height percentiles, a height optimized for woman at the bottom of the height range may be too low for a man at the top of the height range.

Test systems based on racks and cabinets often come with mass interconnects (MICs) used for attachment of fixtures used to interface DUTs (Devices Under Test) with test systems. In many cases, human operators are responsible for manually connecting DUTs to the fixtures before those DUTs are tested and disconnecting them after tests are completed. The same applies to test fixture stands/carts and similar equipment—this is applicable when test fixtures are not directly attached to test systems.

Traditionally, test systems are created with fixed interface heights. This may present a challenge to operators of certain sizes and physical abilities.

In addition to human interfaces, it may be desirable for the test system to interface with other machinery at various heights to allow for optimal automation. It is common to use the same test system for multiple different DUTs or to integrate it into different manufacturing/production lines, which may involve connections at different heights. A test system with a static interface height is a burden for flexible use of tests systems. Additionally, the static height may limit the methods for servicing the test equipment integrated into the automated production line in a short time.

Embodiments herein describe test racks and cabinets equipped with one or more actuators configured to adjust the height of the mass interconnect. While some embodiments are described in reference to test racks and cabinets, it is within the scope of the present disclosure to utilize actuators to reposition MICs in other types of devices, such as test fixture stands, carts, or similar equipment.

FIGS. 2-9—Rack with Adjustable MIC

Embodiments herein describe a variety of racks or cabinets configured to house a mass interconnect (MIC) and one or more test instruments or equipment. The rack may include a housing configured to contain the one or more test instruments or equipment and the MIC. The MIC may have inputs to couple to the test instruments for receiving signals, data, and/or other information. The MIC may also have one or more outputs that are configured to couple to another MIC (e.g., a second MIC installed on a second rack or cabinet). The rack may have one or more legs positioned underneath the housing to support the housing and the MIC.

In some embodiments, the rack may include one or more actuators configured to reposition the MIC and/or other components of the rack. In exemplary embodiments, the actuator(s) reposition the MIC without adjusting the position of the legs of the rack, and/or without adjusting the position of the housing. The actuator may be configured to move the MIC and/or other components linearly (e.g., up or down), or along any arbitrary direction(s). In some embodiments, the actuator is configured to adjust an orientation angle of the MIC, to facilitate connection with other devices. As used herein, a "actuator" refers generally to any type of device capable of moving another device, and is not intended to specifically limit the mechanism by which this motion is achieved. For example, the actuator may be a motor-driven device attached to a rail or a hydraulic lift, among other possibilities.

Figure 2:
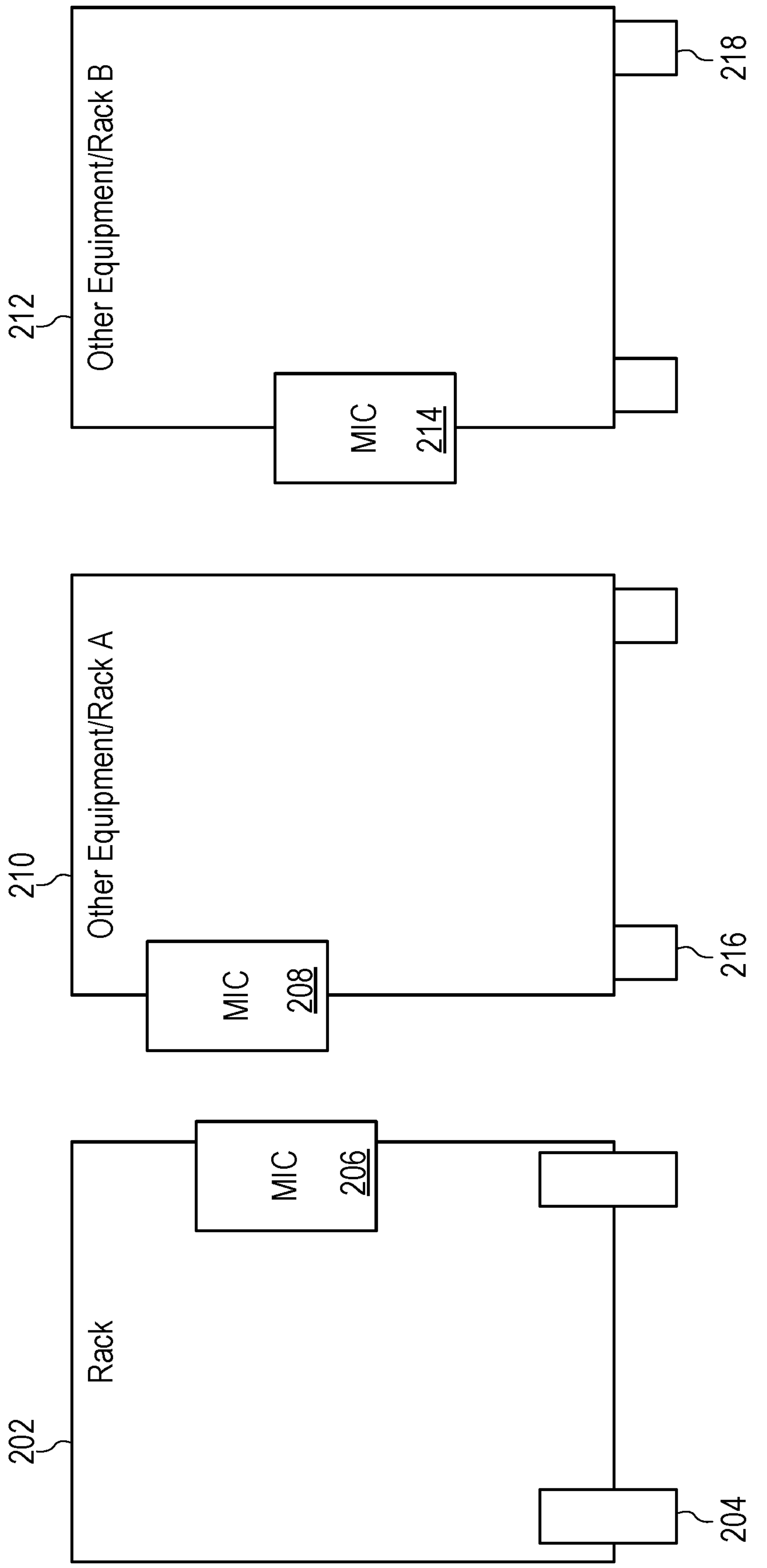
FIG. 2 illustrates a first rack with a first MIC configured to connect to other MICs on two other racks, according to some embodiments.

FIGS. 2-8 illustrate various example racks, according to embodiments described herein. In some embodiments, as illustrated in FIG. 2, a single rack 202 with test equipment positioned inside is configured to plug into other racks or other pieces of equipment which may have variation their respective MIC locations. The MIC 206 on the test rack 202 may be configured to plug into other MICs (208, 214) installed on other racks (210, 212), and the rack may have a MIC that is moveable to match the location on the other equipment. Various embodiments utilize different rack configurations to enable movement of the MIC, as described herein. The racks illustrated in FIG. 2-8 show linear actuators that are configured to move up and down in the vertical direction. More generally, the actuators may be configured to reposition the MIC in any direction, and/or may be configured to rotate the MIC to alter its orientation angle, to facilitate access by a user and/or a connection with other devices.

Figure 3:
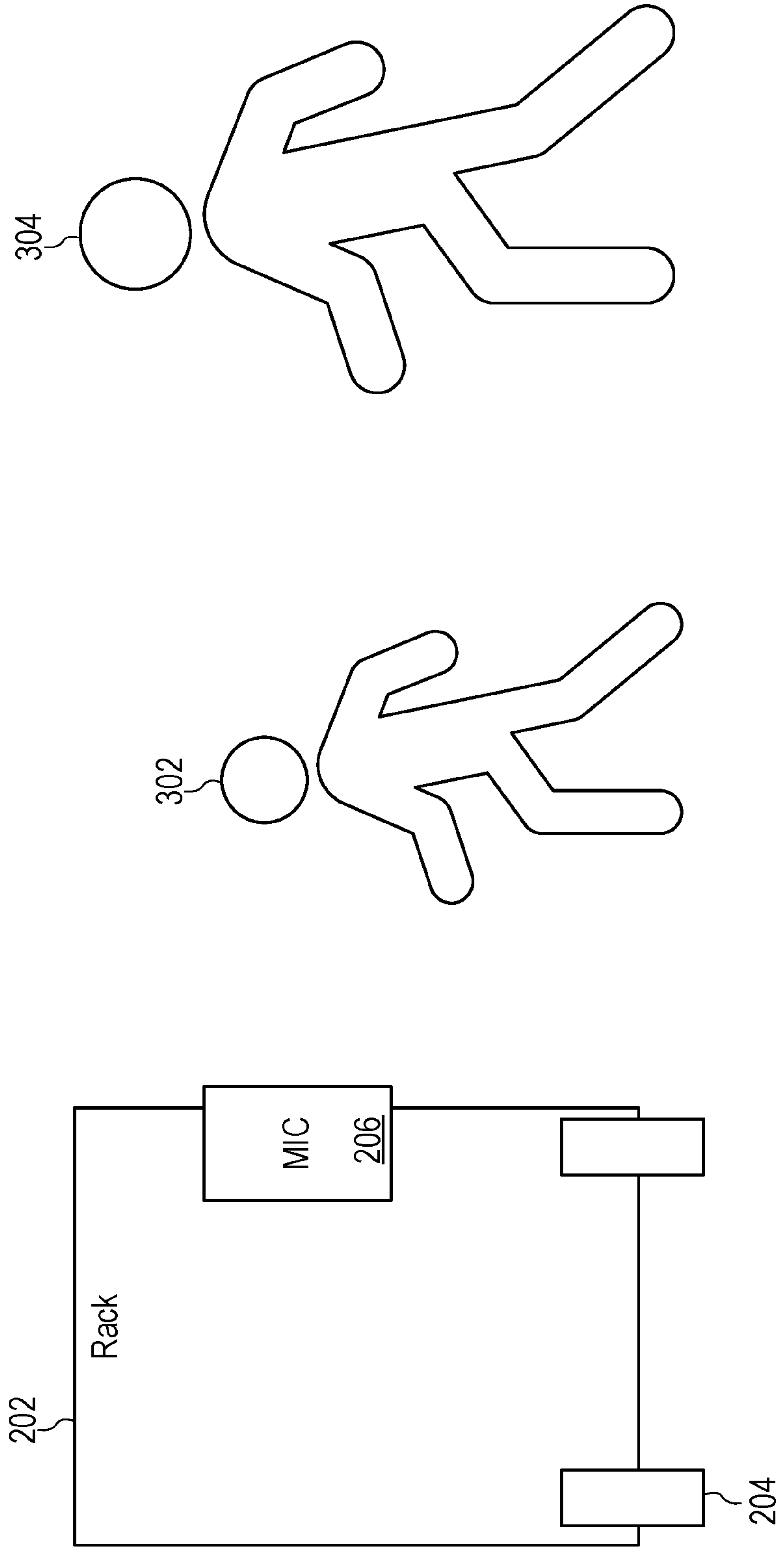
FIG. 3 illustrates how operators of different size may preferentially interface with a MIC at different heights, according to some embodiments.

In addition to moving the MIC to match the location of another MIC, a rack with an adjustable MIC may be used in an ergonomically comfortable way by people (302, 304) of different sizes and/or body shapes, as shown in FIG. 3.

Figure 4:
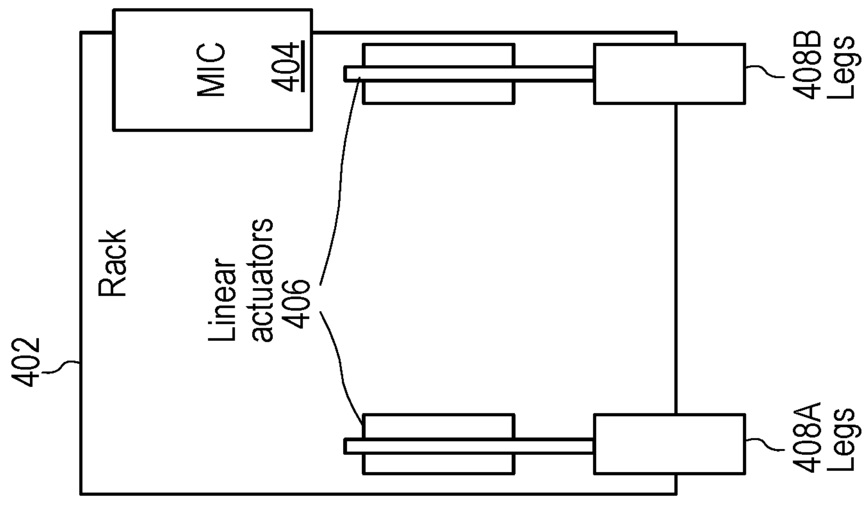
FIG. 4 illustrates a rack with actuators configured to move the housing and MIC without moving the legs, according to some embodiments.

FIG. 4 illustrates a rack 402 with a MIC 404 installed in a fixed location in or on the housing, where the entire body of the rack shifts up and down as the linear actuators 406 extend or contract the legs 408A-B. As illustrated, the legs of the rack may be attached to actuators, which are in turn fixed to the rack. In the illustrated embodiment, the legs of rack are fixed and the actuators move up and down along the legs to cause the housing and the MIC to move up and down. Note that while only two legs and actuators are shown in FIG. 4; the system may include one, three or four legs, as desired. The rack design illustrated in FIG. 4 may be desirable, for example, when the MIC is located on the outside of the rack (e.g., on the top or on the side).

In some embodiments, the legs may be caster wheels fixed to the bottom of the housing. In some embodiments, the rack may rest directly on the floor without legs. In these embodiments, the MIC may be configured to move by the actuators independently of the housing, and either independently or concurrently with the instruments or equipment, as desired.

Figure 5A:
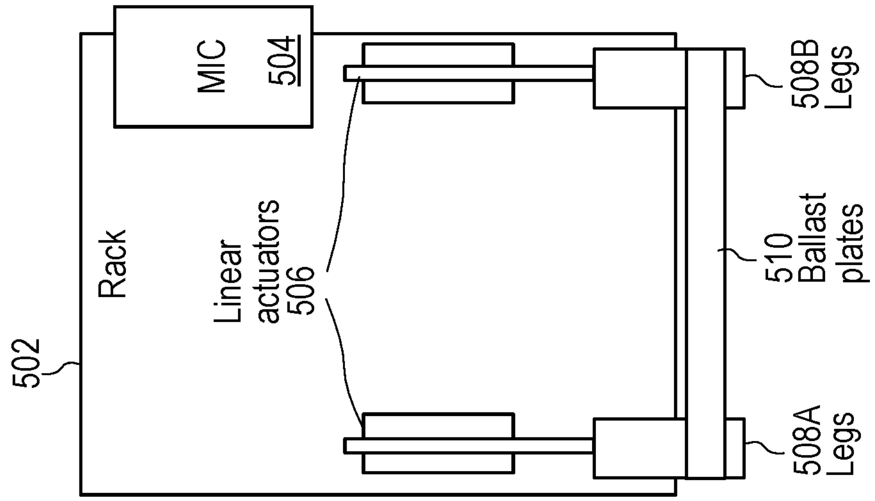
FIG. 5A illustrates a rack with immovable ballast plates attached to the legs, according to some embodiments.

FIG. 5A illustrates a rack 502 with the legs 508A-B of the rack attached to actuators 406 and one or more ballast plates 510 attached to the stationary base of the legs. In the illustrated configuration, the legs of the rack and the ballast plate are fixed, and the actuators are configured to move the rest of the rack up and down. The ballast plate may make the rack more stable by lowering the center of gravity (CoG) of the rack. Advantageously, the ballast plate contributes to the CoG at its stationary height (as opposed to being lifted up), increasing stability in the lifted configuration. Alternatively or additionally, in some embodiments, the bottom of the legs may be made extremely heavy to stabilize rack in addition to or rather than having discrete a ballast plate.

Figure 5B:
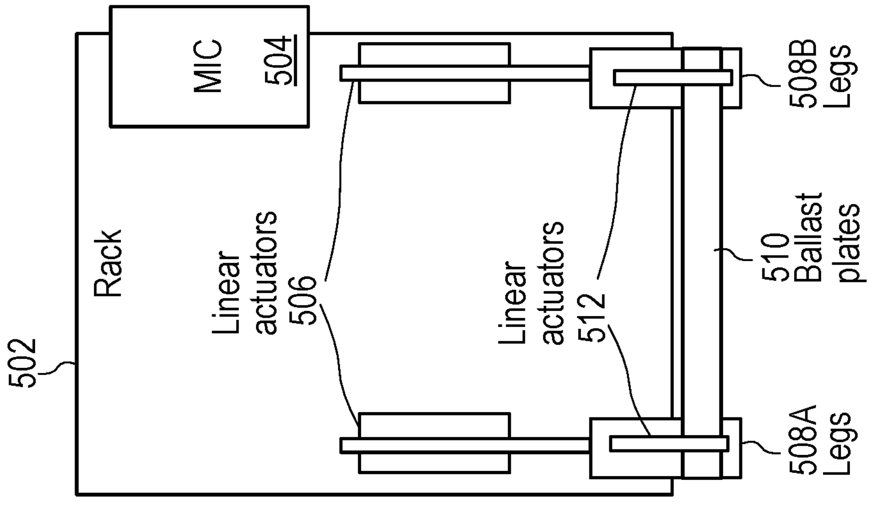
FIG. 5B illustrates a rack with moveable ballast plates configured to compensate for movement of the MIC, according to some embodiments.

In some embodiments, as shown in FIG. 5B, a second actuator (or set of actuators) 512 is connected to the ballast plate(s) 510 and is configured to adjust the position of the ballast plates in an opposite direction to that in which the one or more actuators are adjusting the position of the first MIC. For example, a processor may be coupled to the actuators of both the MIC and the ballast plates to synchronize their movement in opposite directions. Advantageously, the oppositional motion of the ballast plates to the MIC and/or housing may reduce a change in a center-of-mass of the rack while the position of the MIC is being adjusted. Note that FIG. 5B illustrates a particular arrangement with two linear actuators 512 connected to the ballast plates 510 at the location of the legs 508, though other arrangements and/or numbers of actuators may also be used, as desired.

Figure 6:
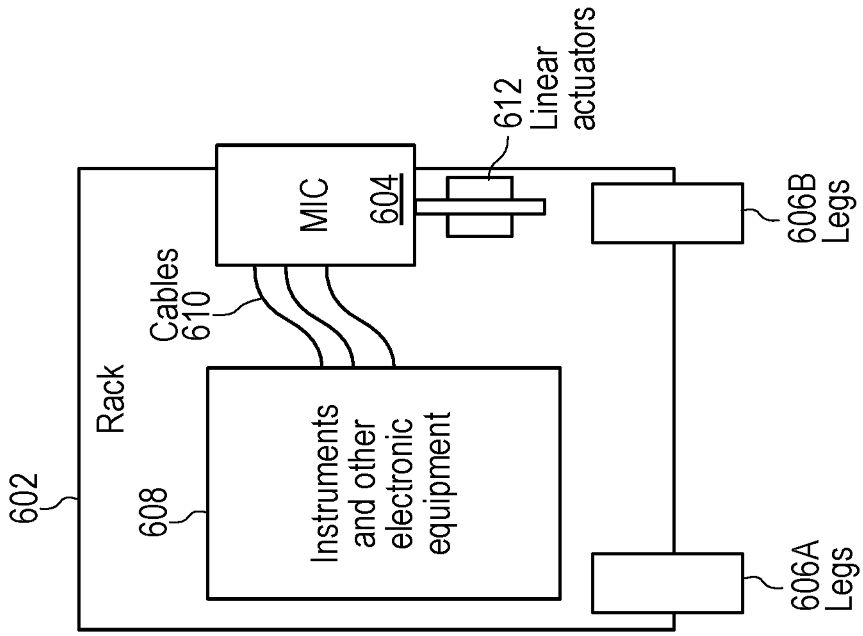
FIG. 6 illustrates a rack with an actuator that moves the MIC without moving the housing, the instruments or equipment, or the legs, according to some embodiments.

FIG. 6 illustrates a rack 602 where the body of the rack does not move, and only MIC 604 is repositioned directly using actuators 612. Cables 610 may be utilized between components in the rack 608 and MIC 604 with enough slack and/or flexibility to support movement of the MIC throughout a desired range of motion. For example, the MIC may couple to the instruments via flexible cables of sufficient length to allow independent movement of the MIC relative to the housing and/or the instruments. The MIC side of the rack may allow for movement of the MIC. Advantageously, in this setup the CoG impact of moving the MIC is reduced, smaller actuators may be used, and the overall rack height does not change while raising and lowering the MIC.

Figure 7:
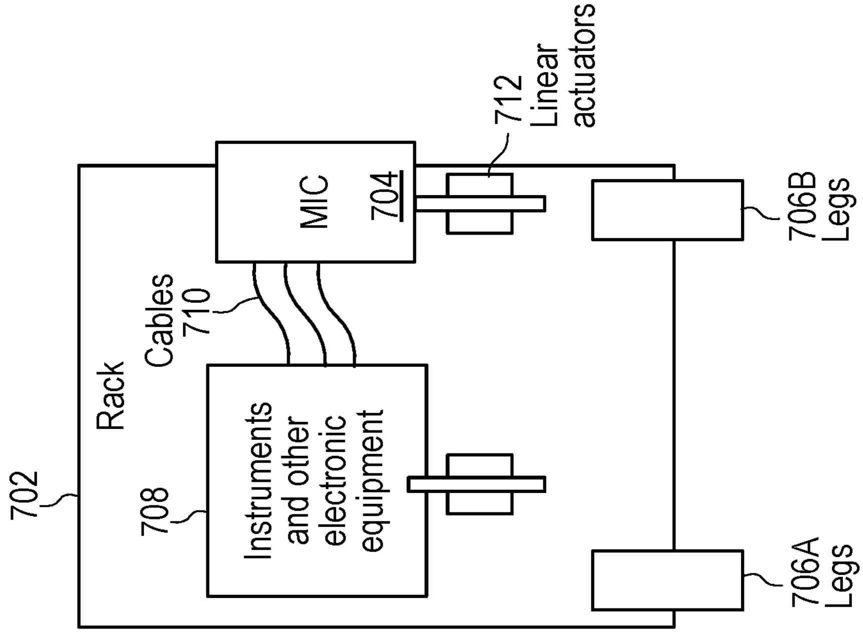
FIG. 7 illustrates a rack with actuators that move the MIC and the instruments or equipment without moving the housing or the legs of the rack, according to some embodiments.

FIG. 7 illustrates a rack 702 where the body of the rack does not move, and the MIC 704 and the instruments 708 and equipment can move together (or independently, as desired to manage cable lengths and flexibility) as the MIC adjusts position. In this setup, the overall rack height and distance above the ground does not change while the MIC is moved.

Figure 8:
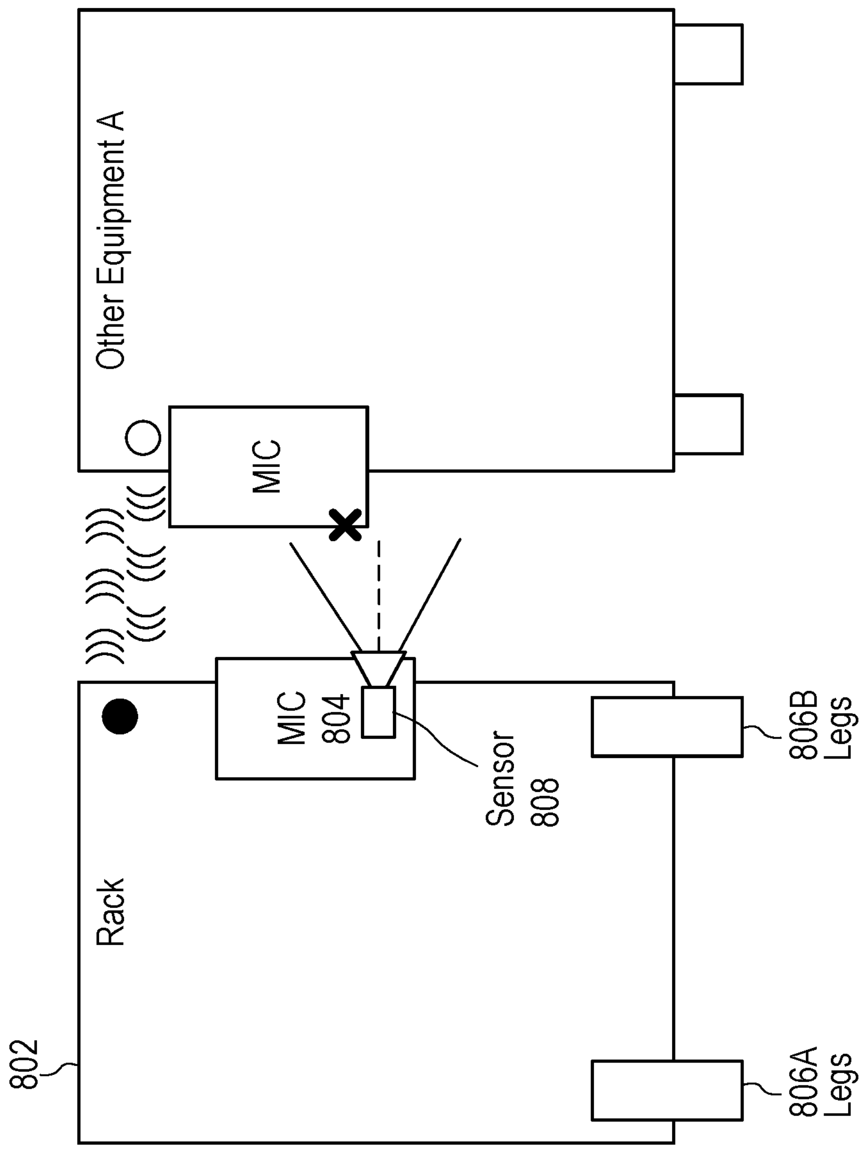
FIG. 8 illustrates a rack configured with a sensor to automate MIC positioning, according to some embodiments.
Figure 9:
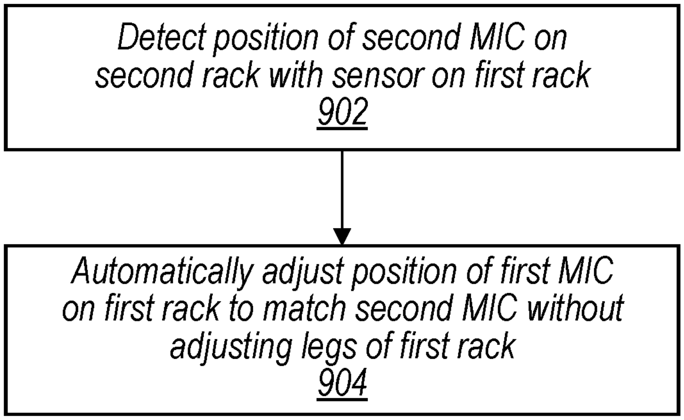
FIG. 9 is a flowchart diagram illustrating a method to automatically reposition a MIC within a rack, according to some embodiments.

FIG. 8 illustrates a rack 802 configured to automate MIC position. Several methods may be used to enable automated MIC positioning. An example method for automating MIC position is illustrated in FIG. 9. In some embodiments, the rack has installed thereon a sensor 808. At 902, the sensor detects the position of another MIC installed on another rack. At 904, the rack automatically adjusts the position of the first MIC to facilitate connection with the other detected MIC.

In some embodiments, the rack and the other equipment wirelessly coordinate where to move the MIC based on location data or based on an identification of the equipment which the MIC is configured to attach to. For example, the rack may have a camera which searches for an identifier on another piece of equipment (e.g., a MIC on another rack) and may react accordingly. In some embodiments, the sensor is a camera coupled to a processor. The processor may be configured to identify the height of the MIC on the other rack based on an image of the MIC received from the camera. Alternatively, the other MIC may have an identifier printed thereon, or printed on the other rack. The camera may obtain an image of the identifier, and the processor may use the identifier to consult a lookup table stored in memory to determine the height of the MIC. For example, different identifiers may be associated with different racks and/or MICs that are configured with standard heights, and this information may be stored in a lookup table accessible to the processor.

In some embodiments, the sensor is configured to detect an appropriate position for the first MIC based on an image of an operator interacting with the first MIC. For example, the appropriate position may be selected so that the first MIC is positioned at the height of the operator's torso or arms. In these embodiments, the actuators may be configured to automatically adjust the position to the detected appropriate position responsive to detecting the operator.

In some embodiments, the rack includes a wireless communication device coupled to a processor. The wireless communication device may be configured to determine the location of a MIC on a second rack via communication with a second device on the second rack. Responsive to determining the position of the other MIC, the rack may automatically adjust the position of the first MIC to facilitate connection between the first and second MIC.

In some embodiments, the rack includes a processor and a non-transitory computer-readable memory medium coupled to the processor. The processor may be configured to store, in the memory medium, positions to which the first MIC has been adjusted. In other words, the rack may store in memory a history of the positions into which the MIC has been moved. The stored positions may be selectable by an operator via a user interface to automatically adjust the first MIC to the selected position. The user interface may include controls outside of the rack or a remote software user interface, among other possibilities.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, steps in processes and procedures may admit permutation of order, and certain features of the invention may be utilized independently, all as would be apparent to one skilled in the art after having the benefit of this description of the invention. Changes may be made in the elements described herein without departing from the spirit and scope of the invention as defined in the following claims.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A rack, comprising:

a housing configured to contain one or more instruments or equipment;

a first mass interconnect (MIC) mounted within the housing, wherein the first MIC comprises one or more inputs configured to couple to the one or more instruments or equipment and one or more outputs configured to couple to a second MIC separate from the rack;

one or more legs positioned underneath the housing and configured to support the housing and the first MIC; and one or more actuators, wherein the one or more actuators are configured to adjust a position of the first MIC without adjusting a position of the one or more legs.

2. The rack of claim 1, wherein the first MIC is installed at a fixed position within the housing, wherein the housing is connected to the one or more legs via a mechanism configured to move the housing independent of the one or more legs, and wherein the one or more actuators are configured to reposition the first MIC together with the housing without repositioning the one or more legs.

3. The rack of claim 1, further comprising:

one or more ballast plates connected to the one or more legs, wherein the one or more actuators are further configured to adjust the position of the first MIC without adjusting a position of the one or more ballast plates.

4. The rack of claim 1, further comprising:

one or more ballast plates connected to the one or more legs; and a second actuator connected to the one or more ballast plates;

wherein the second actuator is configured to adjust a position of the one or more ballast plates in an opposite direction to that in which the one or more actuators are adjusting the position of the first MIC to reduce a change in a center-of-mass of the rack while the position of the first MIC is being adjusted.

5. The rack of claim 1, wherein the one or more actuators are configured to directly reposition the first MIC without repositioning the housing or the one or more instruments or equipment; and wherein the first MIC is configured to couple to the one or more instruments via flexible cables of sufficient length to allow independent movement of the first MIC relative to the housing or the one or more instruments or equipment.

6. The rack of claim 1, wherein the one or more actuators are configured to adjust the position of the first MIC together with the one or more instruments or equipment without repositioning the one or more legs or the housing.

7. The rack of claim 1, further comprising:

a sensor configured to determine a position of the second MIC, wherein, responsive to determining the position of the second MIC, the rack is configured to automatically adjust the position of the first MIC to facilitate connection between the first and second MIC.

8. The rack of claim 7, wherein the sensor comprises a camera coupled to a processor, wherein the sensor is configured to determine the height of the second MIC based on an image of the second MIC.

9. The rack of claim 7, wherein the sensor comprises a camera coupled to a processor, wherein the camera is configured to obtain an image of an identifier of a second rack comprising the second MIC, and wherein the processor is configured to determine the height of the second MIC from a lookup table using the identifier.

10. The rack of claim 1, further comprising:

a sensor configured to detect an appropriate position for the first MIC based on an image of an operator interacting with the first MIC, wherein the one or more actuators are configured to automatically adjust the position to the appropriate position responsive to detecting the appropriate position.

11. The rack of claim 1, further comprising:

a wireless communication device coupled to a processor, wherein the wireless communication device is configured to determine the location of the second MIC via communication with a second device on a second rack comprising the second MIC, and wherein, responsive to determining the position of the second MIC, the rack is configured to automatically adjust the position of the first MIC to facilitate connection between the first and second MIC.

12. The rack of claim 1, further comprising:

a processor; and a non-transitory computer-readable memory medium coupled to the processor, wherein the processor is configured to store, in the memory medium, positions to which the first MIC has been adjusted, wherein the stored positions are selectable by an operator via a user interface to automatically adjust the first MIC to the selected position.

13. The rack of claim 12, wherein the user interface comprises controls outside of the rack or a remote software user interface.

14. A rack, comprising:

a housing configured to contain one or more instruments or equipment;

a first mass interconnect (MIC) mounted within the housing, wherein the first MIC comprises one or more inputs configured to couple to the one or more instruments or equipment and one or more outputs configured to couple to a second MIC separate from the rack; and one or more actuators, wherein the one or more actuators are configured to adjust a position of the first MIC without adjusting a position of the housing.

15. The rack of claim 14, further comprising:

one or more legs positioned underneath the housing and configured to support the housing and the first MIC, wherein the one or more actuators are further configured to adjust the position of the first MIC without adjusting a position of the one or more legs.

16. The rack of claim 14, wherein the one or more actuators are configured to directly reposition the first MIC without repositioning the housing or the one or more instruments or equipment; and wherein the first MIC is configured to couple to the one or more instruments via flexible cables of sufficient length to allow independent movement of the first MIC relative to the housing or the one or more instruments or equipment.

17. The rack of claim 14, wherein the one or more actuators are configured to adjust the position of the first MIC together with the one or more instruments or equipment without repositioning the housing.

18. The rack of claim 14, further comprising:

one or more ballast plates connected to the housing; and one or more second actuators connected to the one or more ballast plates;

wherein the one or more second actuators are configured to adjust a position of the one or more ballast plates in an opposite direction to that in which the one or more actuators are adjusting the position of the first MIC to reduce a change in a center-of-mass of the rack while the position of the first MIC is being adjusted.

19. A method, comprising:

by one or more actuators, adjusting a first position of a first MIC mounted on a first test system rack, wherein the first MIC comprises one or more inputs configured to couple to the one or more instruments or equipment and one or more outputs configured to couple to a second MIC separate from the first test system rack, wherein the first test system rack comprises a housing configured to contain the one or more instruments or equipment and one or more legs positioned underneath the housing and configured to support the housing and the first MIC, wherein adjusting the first position does not adjust a third position of the one or more legs.

20. The method of claim 19, wherein the first test system rack further comprises one or more ballast plates connected to the one or more legs and a second actuator connected to the one or more ballast plates, the method further comprising:

by the second actuator, adjusting a second position of the one or more ballast plates in an opposite direction to that in which the one or more actuators adjust the position of the first MIC to reduce a change in a center-of-mass of the first test system rack while the first position of the first MIC is being adjusted.

* * * * *